United States Patent
Shi et al.

(10) Patent No.: US 7,248,665 B2
(45) Date of Patent: Jul. 24, 2007

(54) PRESCALER

(75) Inventors: Bingxue Shi, Beijing (CN); Baoyong Chi, Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 66 days.

(21) Appl. No.: 10/908,074

(22) Filed: Apr. 27, 2005

(65) Prior Publication Data

US 2006/0245534 A1  Nov. 2, 2006

(51) Int. Cl.
*H03K 21/00* (2006.01)
(52) U.S. Cl. ............... 377/47; 377/48; 327/115; 327/117
(58) Field of Classification Search ............ None
See application file for complete search history.

(56) References Cited

U.S. PATENT DOCUMENTS

| | | | | |
|---|---|---|---|---|
| 4,752,592 A | * | 6/1988 | Tamura et al. | 438/796 |
| 5,661,675 A | * | 8/1997 | Chin et al. | 708/670 |
| 6,060,910 A | * | 5/2000 | Inui | 326/98 |
| 6,385,276 B1 | * | 5/2002 | Hunt et al. | 377/47 |
| 6,462,595 B1 | * | 10/2002 | Hsu et al. | 327/215 |
| 6,737,900 B1 | * | 5/2004 | Wu | 327/218 |
| 6,759,876 B2 | * | 7/2004 | Inoue et al. | 326/98 |
| 6,822,491 B1 | * | 11/2004 | Glass | 327/115 |
| 6,919,739 B2 | * | 7/2005 | Ngo | 326/98 |
| 6,968,029 B1 | * | 11/2005 | Lee et al. | 377/47 |
| 2002/0070758 A1 | * | 6/2002 | Krishnamurthy et al. | 326/98 |
| 2003/0141912 A1 | * | 7/2003 | Sudjian | 327/208 |

FOREIGN PATENT DOCUMENTS

| EP | 1469604 | * 10/2004 |
|---|---|---|
| JP | 60-216629 | * 10/1985 |

* cited by examiner

*Primary Examiner*—Tuan Lam
(74) *Attorney, Agent, or Firm*—Jianq Chyun IP Office

(57) ABSTRACT

Disclosed is a Dual-Modulus Prescaler (DMP) dividing an input signal into an output signal, comprising: a synchronous counter, including a D-Flip-Flop (DFF), a first NOR-Flip-Flop and a second NOR-Flip-Flop, receiving the input signal, the division ratio thereof being based on an intermediate signal; a control logic, controlling the division ratio of the synchronous counter and selecting the output frequency based on first and second control signals, and outputting the intermediate signal to the synchronous counter; and an asynchronous counter, coupled to the control logic and the synchronous counter, having a chain of five DFFs.

3 Claims, 5 Drawing Sheets

PRESCALER

BACKGROUND OF THE INVENTION

1. Field of Invention

The present invention relates to a prescaler. More particularly, the present invention relates to a dual-modulus prescaler (DMP) with dynamic circuit technique.

2. Description of Related Art

Frequency synthesizers are widely used in communication systems and microprocessors. A frequency synthesizer at least includes a frequency divider and a voltage-controlled oscillator (VCO). The operating frequency of the frequency synthesizer is limited by the frequency divider and the voltage-controlled oscillator (VCO).

A dual-modulus prescaler (DMP) is a leading example in the frequency divider. A prescaler at least includes two parts, i.e., a synchronous counter and an asynchronous counter. The synchronous counter is the most crucial block in the whole DMP. The synchronous counter works at maximum frequency and consumes most power. The speed of the synchronous counter limits the maximum operating frequency of the prescaler. A merge structure of NAND gates and D-Flip-Flops (DFFs) is popular. When the synchronous counter is implemented in P-precharge dynamic circuit techniques, there are two serial NMOS transistors in the discharge path, which results a large delay and lowers the operating frequency.

With a structure optimization of the synchronous counter, the operating frequency of the prescaler is increased and the power consumption thereof is lowered. Besides, there is a demand on an optimized structure of the DMP, which may reduce the propagation delay and have higher operating speed.

Therefore, there is a need for developing a DMP meeting the requirements.

SUMMARY OF THE INVENTION

One of the objects of the invention is to provide a dual-modulus prescaler (DMP) with higher operating frequency, lower power consumption, reduced propagation delay reduced and higher operation speed.

To at least achieve the above and other objects, the invention provides a Dual-Modulus Prescaler (DMP) dividing an input signal into an output signal, comprising: a synchronous counter, including a D-Flip-Flop (DFF), a first NOR-Flip-Flop and a second NOR-Flip-Flop, receiving the input signal, the division ratio thereof being based on an intermediate signal; a control logic, controlling the division ratio of the synchronous counter and selecting the output frequency based on first and second control signals, and outputting the intermediate signal to the synchronous counter; and an asynchronous counter, coupled to the control logic and the synchronous counter.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
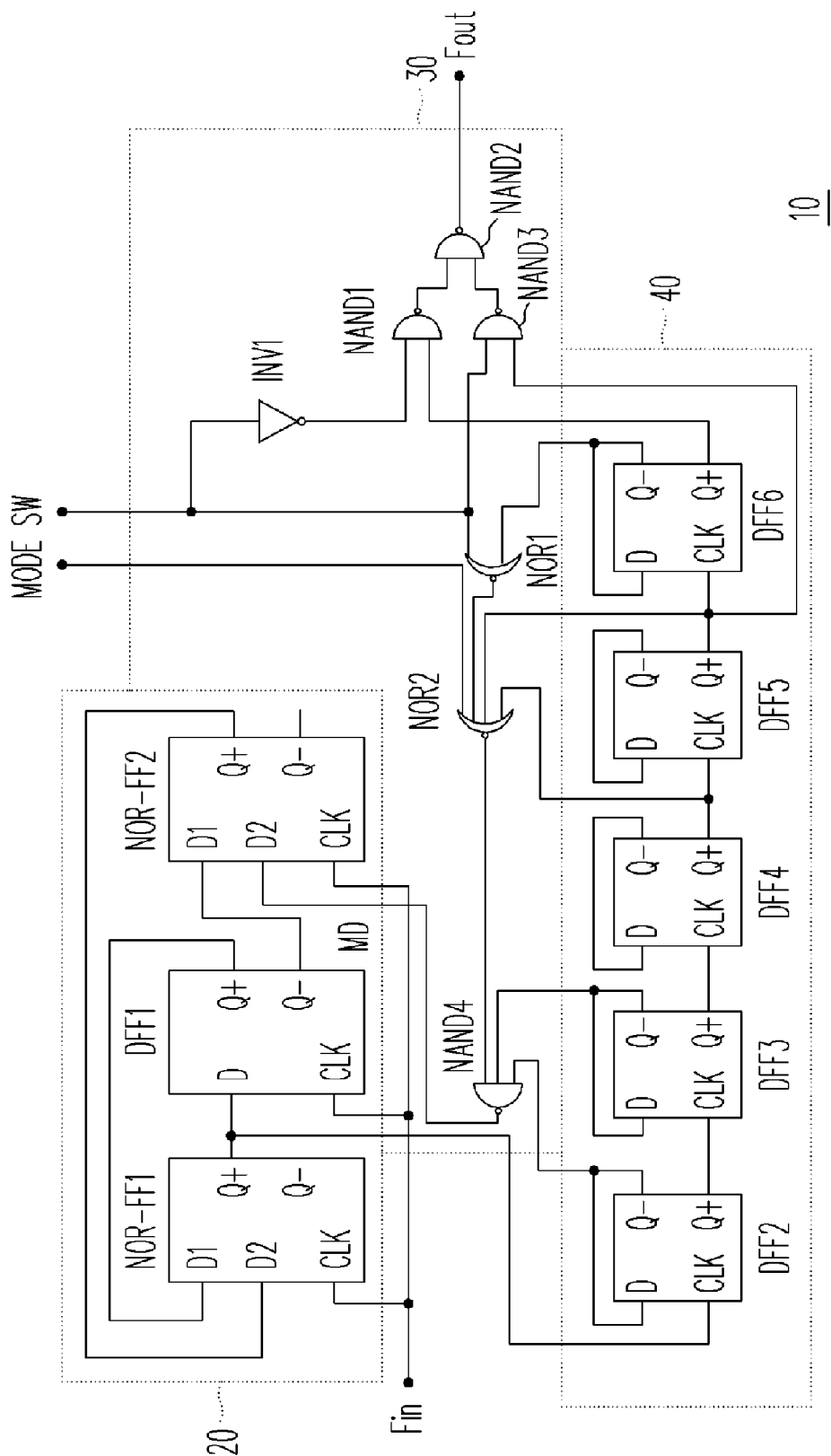
FIG. 1 is a block diagram of a dual-modulus prescaler (DMP) according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In this invention, a Dual-Modulus (divide-by-128/129 or 64/65) Prescaler (DMP) based on dynamic circuit technique implemented in 0.25 µm CMOS digital technology is disclosed.

The block diagram of the disclosed DMP is shown in FIG. 1. The DMP 10 includes a synchronous counter 20, a control logic 30, and an asynchronous counter 40.

The synchronous counter 20 is, for example but not limited to, a divide-by-4/5 counter. When the control signal MD outputting from the control logic 30 is logic high (MD=1), the division ratio of the synchronous counter 20 is four. When the control signal MD is logic low (MD=0), the division ratio of the synchronous counter 20 is five.

In this invention, the synchronous counter 20 is made up of one D-Flip-Flop (DFF) DFF1 and two NOR-Flip-Flops (NOR-FF) NOR-FF1 and NOR-FF2. The NOR-FF is a flip-flop with NOR logic function. In the merge structure of NOR-FFs and DFF, the sizes of logic blocks are small, and fast storage elements share the same delays. So the propagation delay is reduced and the speed of the synchronous counter 20 is improved. These flip-flops are based on glitch-free configuration, but many modifications may be made to adapt the speed requirement of high frequency circuits. The input signal Fin is fed into the CLK terminals of the DFF1 and the NOR-FF1 and NOR-FF2.

Figure 2:
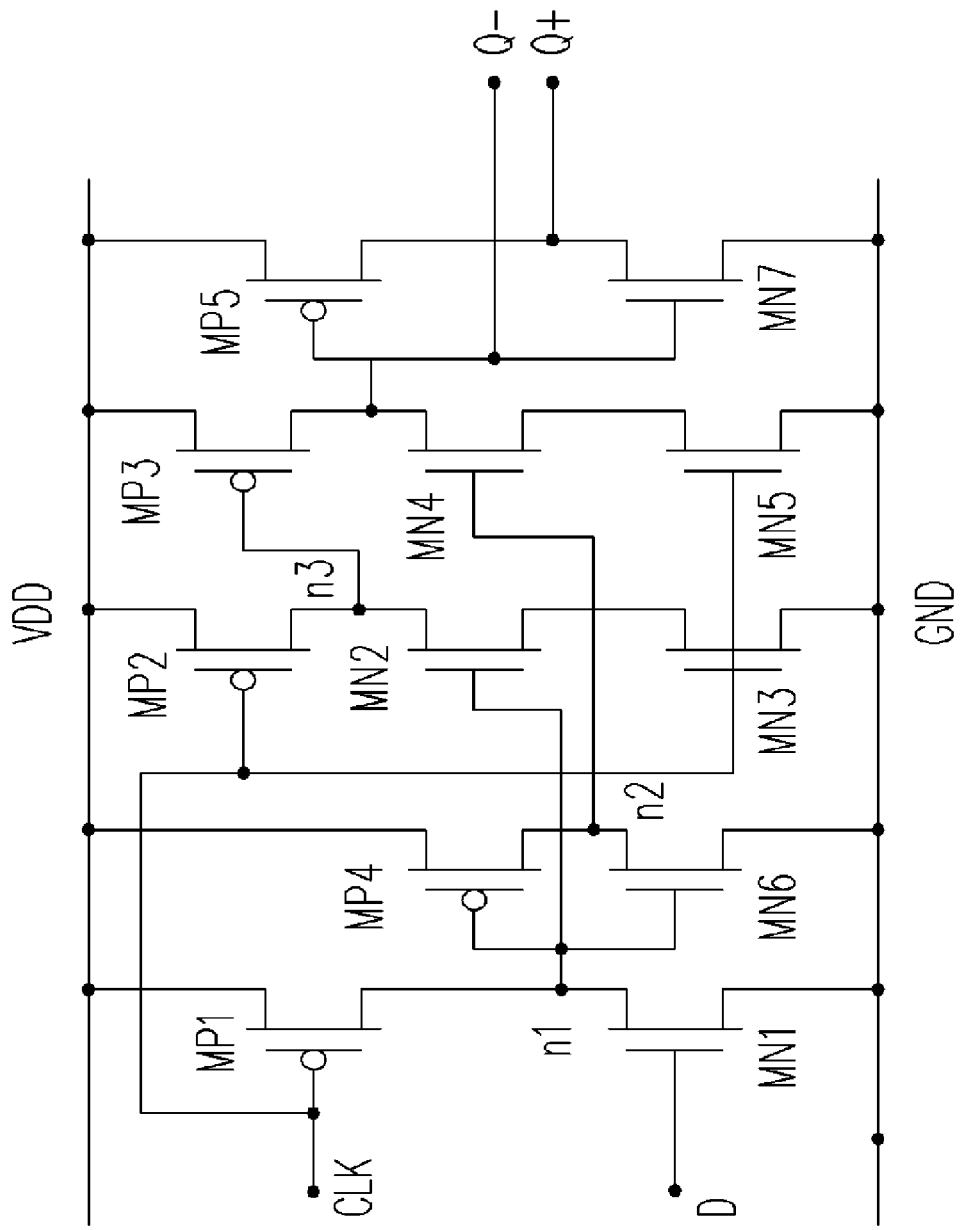
FIG. 2 is a block diagram of a D-Flip-Flop (DFF) in the DMP of FIG. 1.

FIG. 2 shows the DFF1 in the synchronous counter 20. The DFF 1 includes PMOS transistors MP1~MP5 and NMOS transistor MN1~MN7. The source electrodes of MP1~MP5 are connected to VDD and the sources electrodes of MN1, MN3, and MN5~MN7 are connected to GND. The signal CLK (the input signal Fin in FIG. 1) is connected to the gate electrodes of MP1, MP2, MN3 and MN5. The input terminal D is connected to the gate electrode of MN1. An internal node n1 is connected to the drain electrodes of MP1 and MN1, and the gate electrodes of MP4, MN2, and MN6. An internal node n2 is connected to the drain electrodes of MP4 and MN6, and the gate electrode of MN4. An internal node n3 is connected to the drain electrodes of MP2 and MN2, and the gate electrode of MP3. The source electrode of MN2 is connected to the drain electrode of MN3. The source electrode of MN4 is connected to the drain electrode of MN5. An output Q− is connected to the drain electrodes of MP3 and MN4, and the gate electrodes of MP5 and MN7. An output Q+ is connected to the drain electrodes of MP5 and MN7.

When CLK=0, the DFF1 is in hold state and the internal nodes are pre-charged through the PMOS transistors (MP1 and MP2) controlled by the CLK signal. At rising edges of CLK, DFF1 changes state based on the input signal D.

Compared with prior art, the DFF1 decreases the number of transistors, reduces the capacitive load, shortens the charge and discharge time by the reduction of transistors in the charge and discharge path and lowers dynamic power consumption. These improve the operating speed, reduce dynamic power consumption and make the circuit suitable for GHz frequency range. Although the static power consumption of the DFF1 is slightly increased, in power consumption of high frequency applications, the dynamic power consumption due to continuous switch at high frequency dominates and the static power consumption is not significant.

Figure 3:
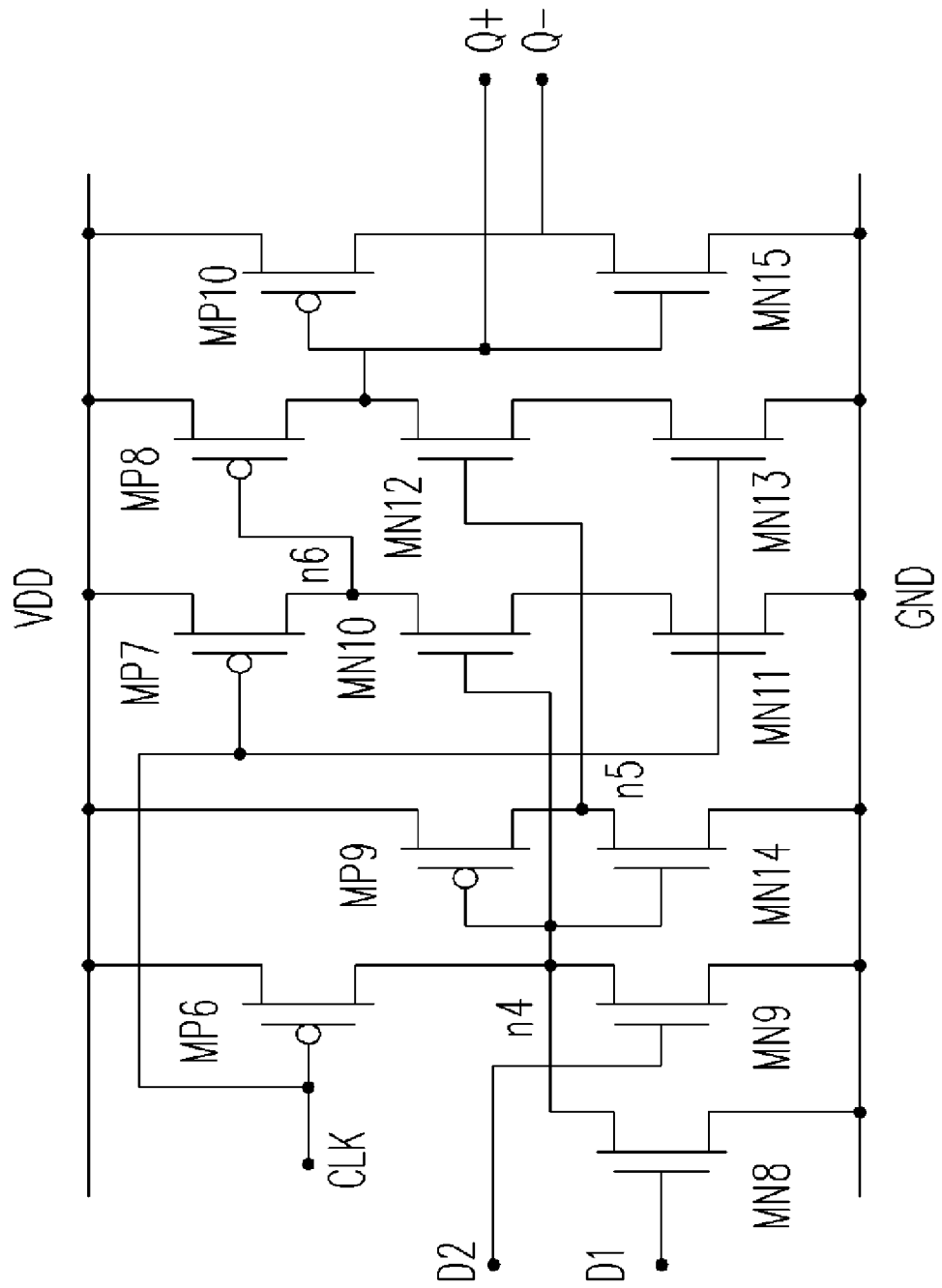
FIG. 3 is a block diagram of an NOR-Flip-Flop (NOR-FF) in the DMP of FIG. 1.

FIG. 3 shows the NOR-FF1 (or NOR-FF2) in the synchronous counter 20. As shown, the NOR-FF1 (or NOR-FF2) includes PMOS transistors MP6~MP10 and NMOS transistors MN8~MN15. The source electrodes of MP6~MP10 are connected to VDD and the sources electrodes of MN8, MN9, MN11, and MN13~15 are connected to GND. The input signal CLK is fed into the gate electrodes of MP6, MP7, MN11 and MN13. The input signal D1 is fed into the gate electrode of MN8, and another input signal D2 is fed into the gate electrode of MN9. An internal node n4 is connected to the drain electrodes of MP6, MN8 and MN9, and the gate electrodes of MP9, MN10 and MN14. An internal node n5 is connected to the drain electrodes of MP9 and MN14, and the gate electrode of MN12. An internal node n6 is connected to the drain electrodes of MP7 and MN10, and the gate electrode of MP8. The source electrode of MN10 is connected to the drain electrode of MN11. The source electrode of MN12 is connected to the drain electrode of MN13. An output Q+ is connected to the drain electrodes of MP8 and MN12, and the gate electrodes of MP 10 and MN15. An output Q– is connected to the drain electrodes of MP10 and MN 15. Based on FIG. 3, it is known that Q+=(D1+D2)' and Q–=(D1+D2).

As shown in FIG. 3, there are two parallel NMOS transistors MN8 and MN9 in the discharge path and they are directly grounded, respectively. Compared to two serial NMOS transistors in the discharge path in prior art, the discharge time is reduced and the speed is improved.

The control logic 30 includes an inverter INV1, two NOR gates NOR1~NOR2 and four NAND gates NAND1~NAND4. The inverter INV1 inverts the control signal SW and outputs to the NAND gate NAND1. The NAND gate NAND1 a two-input NAND gate, inputs the output of the inverter INV1 and the output signal Q+ from the DFF6 of the asynchronous counter 40. The NAND gate NAND3, a two-input NAND gate, inputs the control signal SW and the output signal Q+ from the DFF5 of the asynchronous counter 40. The NAND gate NAND4, a three-input NAND gate, inputs the output from the NOR gate NOR2, the output signal Q– from the DFF3, and the output signal Q– from the DFF2 of the asynchronous counter 40. The NAND gate NAND4 outputs the signal MD to the D2 terminal of the NOR-FF2 in the synchronous counter 20. The NOR gate NOR1, a two-input NOR gate, inputs the control signal SW and the output signal Q– from the DFF6 of the asynchronous counter 40. The NOR gate NOR2, a four-input NOR gate, inputs the control signal MODE, the output from the NOR gaze NOR1, the output signal Q+ from the DFF5 of the asynchronous counter 40, and the output signal Q+ from the DFF4 of the asynchronous counter 40. The NAND gate NAND 2 receives the outputs from the NAND gates NAND1 and NAND3, and outputs the signal Fout. As shown in FIG. 1, the signal Fout is not fed back to the control logic 30.

The control logic 30 controls the division ratio of the first stage and selects the output frequency. The control signal SW is used to select the dual-modulus division ratio as 128/129 or 64/65, while the fractional division ratio is selected according the control signal MODE. According to levels of the control signals SW and MODE, the output frequency of the DMP 10 is shown in following Table.

TABLE

| SW | MODE | Fout |
| --- | --- | --- |
| Low | High | Fin/128 |
| Low | Low | Fin/129 |
| High | High | Fin/64 |
| High | Low | Fin/65 |

Fout is the frequency of the output signal OUT, and Fin is the frequency of the input signal IN. As shown in the above Table, when the signal SW is Logic Low and the signal MODE is Logic High, Fout is Fin/128, which means the DMP 10 executes a divide-by-128 operation. When the signal SW is Logic Low and the signal MODE is Logic Low, the frequency of Fout is Fin/129, which means the DMP 10 executes a divide-by-129 operation. When the signal SW is Logic High and the signal MODE is Logic High, the frequency of Fout is Fin/64, which means the DMP 10 executes a divide-by-64 operation. When the signal SW is Logic High and the signal MODE is Logic Low, the frequency of Fout is Fin/65, which means the DMP 10 executes a divide-by-65 operation.

The asynchronous counter 40 is a chain of five DFFs, i.e., DFF2~DFF6. The operating frequency thereof is one-fourth or one-fifth of the input frequency, so the speed requirement is decreased. However, it requires the DFF is low power consumption, glitch-free and no limit of the minimum operating frequency to maintain the good performance of the whole circuit. A fast DFF configuration is suitable.

Figure 4A:
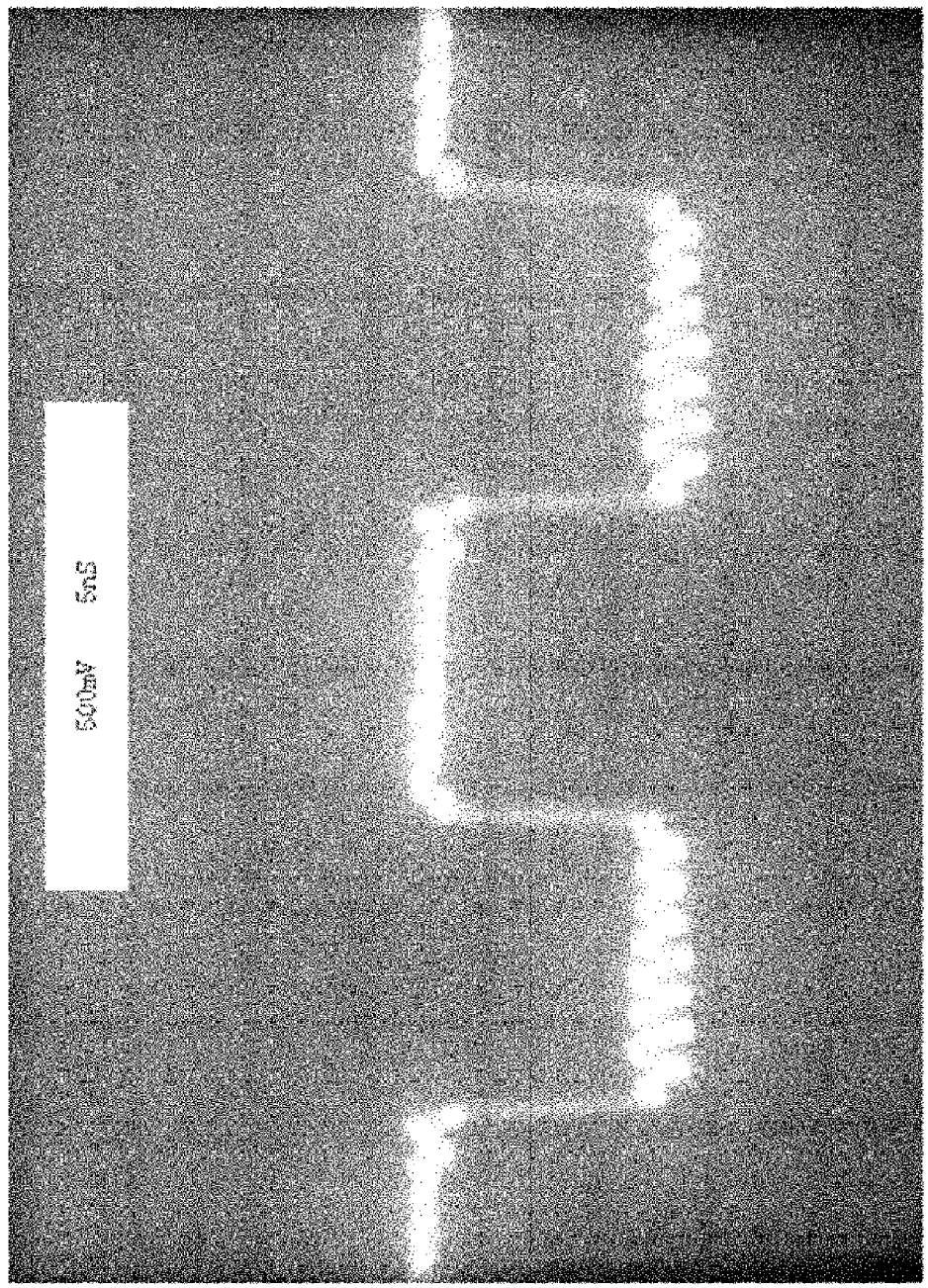
FIGS. 4(a) and 4(b) are output waveforms of the DMP, in divided-by-65 and -64 operations, respectively.
Figure 4B:
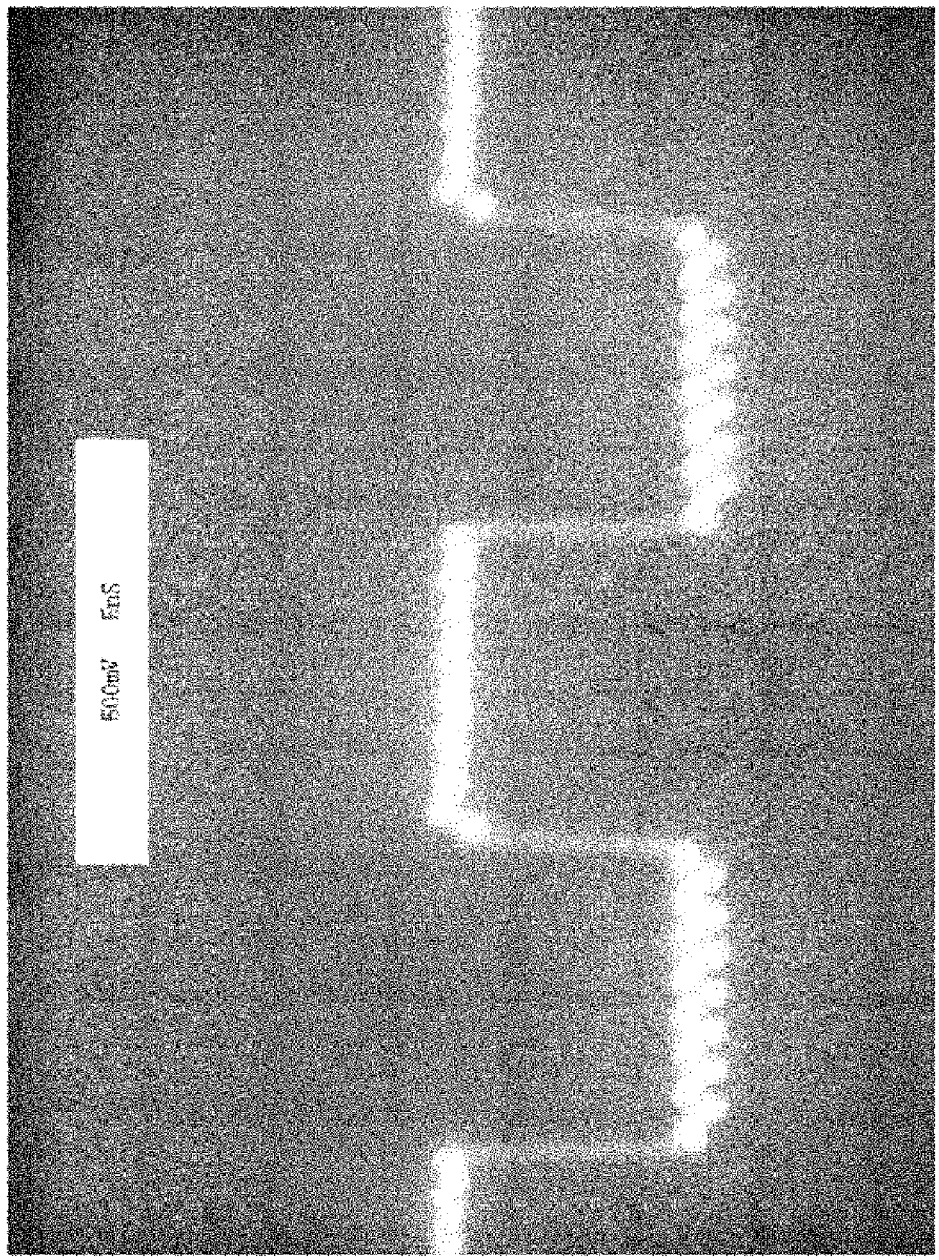

To verify the performance of the DMP in the invention, the DMP is implemented in 0.25 μm single-poly five-metal N-well salicide 2.5V CMOS digital process. FIGS. 4(a) and 4(b) show the output waveforms of the DMP in divide-by-65 operation mode (Fout=Fin/65) and divide-by-64 operation mode (Fout=Fin/64), respectively. In FIGS. 4(a) and 4(b), the input signal is a sine waveform with an amplitude of 0.8V and a frequency of 2.5 GHz and the power supply (VDD) is 2.5V. The horizontal scale is 5 ns/div and the vertical scale is 0.5V/div. Under the conditions, the measured power supply current is 14 mA. So the whole power consumption is 35 mW. Because the prescaler works well at 3 GHz, the maximum input frequency of the prescaler is higher than 3 GHz. The measure result proves the prescaler has excellent performance and may be applied to many RF systems.

As above discussion, a divide-by-128/129 or 64/65 Dual-Modulus prescaler is disclosed. It uses NOR-FF structure instead of NAND-FF structure, and uses dynamic circuit technique to optimize the DFF in the synchronous counter. These make the DMP work at high frequency and keep low power consumption. In this invention, the propagation delay of the DMP is reduces and the operating speed thereof is higher. The experiment results show that the DMP works well in gigahertz (GHz) frequency range.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A prescaler, dividing an input signal into an output signal, comprising:
   a synchronous counter, including a first D-Flip-Flop (DFF), a first NOR-Flip-Flop and a second NOR-Flip-Flop, receiving the input signal, the division ratio thereof being based on an intermediate signal;
   a control logic, controlling the division ratio of the synchronous counter and selecting the output frequency based on first and second control signals, and outputting the intermediate signal to the synchronous counter; and
   an asynchronous counter, being a chain of a plurality of DFFs and coupled to the control logic and the synchronous counter; wherein an output Q– from the stage DFF of the asynchronous counter is connected to the control logic, the output signal is not fed back to the control logic and each of the first NOR-Flip-Flop and the second NOR-Flip-Flop has two parallel transistors that are directly grounded, respectively.

2. The prescaler of claim 1, wherein the division ratio of the synchronous counter is a first value when the intermediate signal is logic high; and the division ratio of the synchronous counter is a second value when the intermediate signal is logic low.

3. The prescaler of claim 1, wherein the asynchronous counter is a chain of five DFFs, and the operating frequency thereof is one of one-fourth and one-fifth of the frequency of the input signal.

* * * * *